United States Patent [19]

Bronner et al.

[11] Patent Number: 5,606,202
[45] Date of Patent: Feb. 25, 1997

[54] PLANARIZED GATE CONDUCTOR ON SUBSTRATES WITH ABOVE-SURFACE ISOLATION

[75] Inventors: Gary B. Bronner; Jack A. Mandelman, both of Dutchess County, N.Y.

[73] Assignee: International Business Machines, Corporation, Armonk, N.Y.

[21] Appl. No.: 428,387

[22] Filed: Apr. 25, 1995

[51] Int. Cl.$^6$ .................................................. H01L 23/48
[52] U.S. Cl. .................. 257/752; 257/756; 257/250; 257/510
[58] Field of Search ..................... 257/250, 381, 257/385, 397, 510, 752, 756, 396

[56] References Cited

U.S. PATENT DOCUMENTS

| | | | |
|---|---|---|---|
| 4,095,251 | 6/1978 | Dennard et al. | 257/399 |
| 4,424,621 | 1/1984 | Abbas et al. | 437/51 |
| 4,570,331 | 2/1986 | Eaton, Jr. et al. | 437/41 |
| 4,803,173 | 2/1989 | Sill et al. | 437/29 |
| 5,122,473 | 6/1992 | Mazzali | 437/40 |
| 5,154,946 | 10/1992 | Zdebel | 437/34 |
| 5,177,028 | 1/1993 | Manning | 437/41 |
| 5,292,683 | 3/1994 | Dennison et al. | 437/63 |
| 5,346,587 | 9/1994 | Doan et al. | 156/657.1 |

FOREIGN PATENT DOCUMENTS 4-76949  3/1992  Japan ........................ 257/396

OTHER PUBLICATIONS

IBM Technical Disclosure Bulletin, "Utilization of Double Poly Nmos Process to Provide Shield for Radiation Hardness" vol. 27 No. 10A Mar. 1985.

IBM Technical Disclosure Bulletin, "Double–Level Polysilicon Memory Cell Process" vol. 19 No. 7 Dec. 1976.

Primary Examiner—Jerome Jackson
Assistant Examiner—Nathan K. Kelley
Attorney, Agent, or Firm—Whitham Curtis, Whitham & McGinn; Susan M. Murray

[57] ABSTRACT

Stringers and depth of focus problems in substrates having above-surface isolation schemes are avoided by applying a first portion of a gate conductor over the entire surface having above-surface isolation, selectively removing the gate conductor from above the isolation features of the above-surface isolation, and overcoating the entire surface with a second portion of gate conductor. The process has particular application to substrates that employ regions having field-shield isolation. An important feature of the invention is drawn to creating structures wherein gate conductor is applied to a substrate including both above-surface and below-surface isolation regions in a manner which leaves the gate conductor planarized over both the above-surface and below-surface regions.

6 Claims, 3 Drawing Sheets

PLANARIZED GATE CONDUCTOR ON SUBSTRATES WITH ABOVE-SURFACE ISOLATION

BACKGROUND OF THE INVENTION

1. Field of the Invention

The invention is generally related to a method for providing planarized gate conductor on a substrate which includes both above-surface isolation and below-surface isolation, and to structures which result from the method.

2. Description of the Prior Art

Surface isolation techniques, such as "field-shield" isolation and "thick above-surface dielectric isolation", are used in semiconductor chip and wafer fabrication techniques to electronically isolate separate devices formed in a substrate. "Field-shield isolation" involves having a conducting layer insulated from the semiconductor or substrate. "Thick above-surface dielectric isolation" involves having a patterned, thick insulation layer (e.g., approximately 300 to 2500Å thick) above the substrate.

These isolation techniques pose difficult problems for proper fabrication of gate conductor materials which must traverse over the above-surface isolation members. FIG. 1a shows a cross-sectional view of a gate conductor 10 on substrate 12 which traverses over isolation members 14, which can be field-shield isolation, thick dielectric isolation or any other above-surface isolation feature, and FIG. 1b shows a plan view of the gate conductor 10 passing over the isolation members 14 and the substrate 12. The cross-sectional view in FIG. 1a is taken along line A—A in FIG. 1b. The isolation members 14 project above the surface of substrate 12 and make the surface non-planar. This non-planarity is transferred to the deposited gate conductor material 10 at region 16 which is the site of the isolation/active area step.

The nonplanar characteristic of the substrate leads to several problems. First, because the substrate is non-planar, there may be depth of focus (DOF) problems in patterning the gate conductor 10 as well as other features in the active area. Specifically, photoresist (not shown) deposited on top of the gate conductor 10 will be thicker at region 16 than at regions above the isolation members 14. Thus, during photolithography, the photoresist will be exposed differently due to the variation in DOF. As is shown in FIG. 1b, the variation in exposure may ultimately lead to variations in the width of the gate conductor 10 at region 16. This width variation will adversely impact on the overall performance of the device due to shortening of the device channel. Second, gate conductor "stringers" 18, which are regions of gate conductor material not removed during etching of the gate conductor, may be formed along the edges of the active areas of substrate 12 due to the increase in the gate conductor thickness at the step from isolation region 14 to substrate region 12. The presence of stringers results in the shorts between adjacent gates.

As micro-electronics manufacturing progresses to smaller, more compact substrates with active areas separated by very little chip real estate, there is a need, when surface isolation techniques are utilized, to provide an effective means for preventing line width variation and stringer formation problems.

SUMMARY OF THE INVENTION

It is an object of this invention to provide a method for applying gate conductor over above-surface isolation features.

It is another object of this invention to provide a planarized gate conductor on a substrate which includes both above-surface isolation and below-surface isolation.

It is yet another object of this invention to provide a method for creating a planarized gate conductor over a substrate having both above-surface isolation and below-surface isolation.

According to the invention, gate conductor is applied over and between above-surface isolation features. The gate conductor is then planarized or selectively removed from above the above-surface isolation features to leave a portion of the gate conductor co-planar with the above-surface isolation-features. If applicable, the gate conductor is not removed from section of the substrate having below-surface isolation. Subsequently, a second portion of gate conductor is deposited over the above-surface isolation features and the remaining portion of gate conductor positioned between the above-surface isolation features. The invention has particular application for substrates which include both above-surface and below-surface isolation schemes. The process creates a substrate having a gate conductor that is co-planar for both the portion of the substrate having above-surface isolation and the portion of the substrate having below-surface isolation.

BRIEF DESCRIPTION OF THE DRAWINGS

The foregoing and other objects, aspects and advantages will be better understood from the following detailed description of the preferred embodiments of the invention with reference to the drawings, in which:

FIG. 1b is a plan view of the prior art gate conductor of FIG. 1a;

DETAILED DESCRIPTION OF THE PREFERRED EMBODIMENTS OF THE INVENTION

The invention is directed to a process which eliminates DOF and stringer problems associated with gate conductor traversing over above-surface isolation. The invention has application to all above-surface isolation schemes including field-shield isolation and thick above-surface dielectric isolation with $SiO_2$ or other materials.

The process also provides the ability to use below-surface isolation in a different portion of the same chip, wafer or other suitable substrate, in which the above-surface isolation is utilized. Below-surface isolation in a substrate may take the form of shallow trench isolation (STI) or similar structure schemes wherein the isolation regions are created in the substrate and extend below the surface. It is envisaged that it will be advantageous to use STI or other suitable below-surface isolation in the supports or peripheral circuitry (e.g., CMOS logic, etc.), and field-shield isolation or other suitable above-surface isolation for the array of a dynamic random access memory (DRAM).

Field-shield isolation is effective and easily applied to areas containing only one transistor type (n-FET or p-FET), such as a DRAM array. Furthermore, field-shield isolation is free of corner parasitic effects and threshold voltage ($V_t$) control problems associated with STI. However, field-shield isolation in the chip area containing CMOS support circuitry is wasteful of silicon real estate. Thus, there is a need for using STI for CMOS logic when field-shield isolation is desired in the array.

Figure 1B:
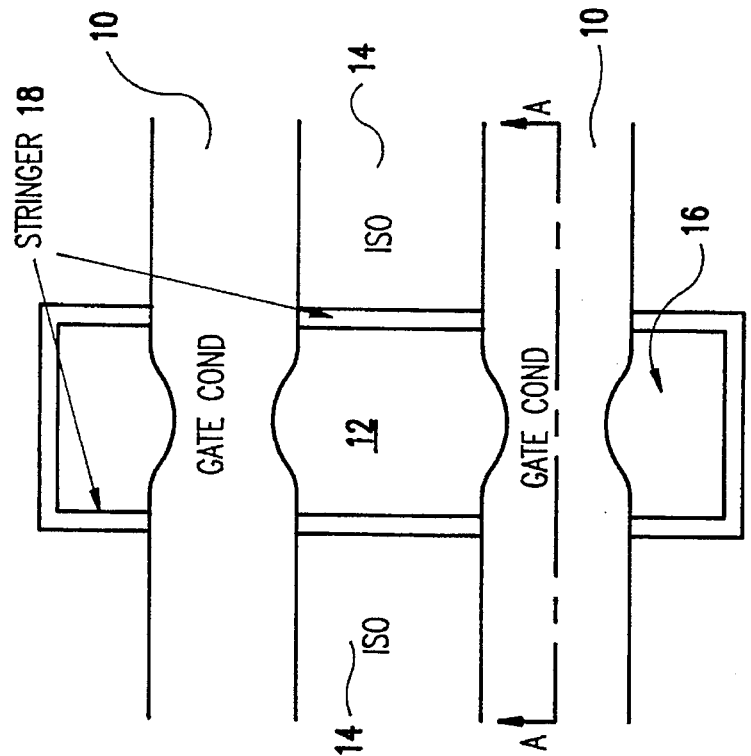
Figure 1A:
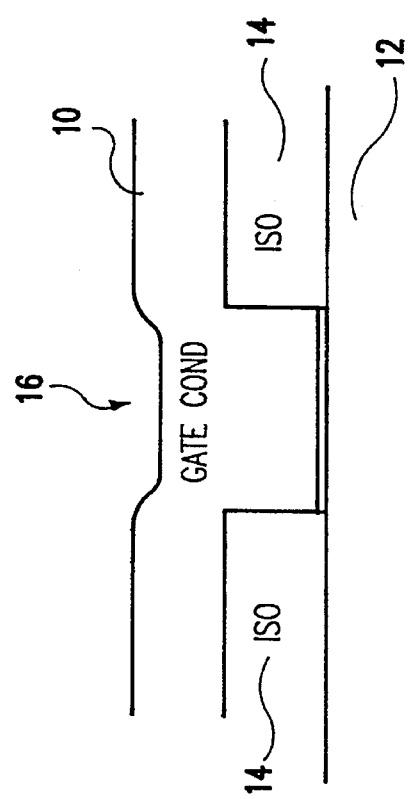
FIG. 1a is a cross-sectional view of a prior art gate conductor traversing over above-surface isolation regions.
Figure 2B:
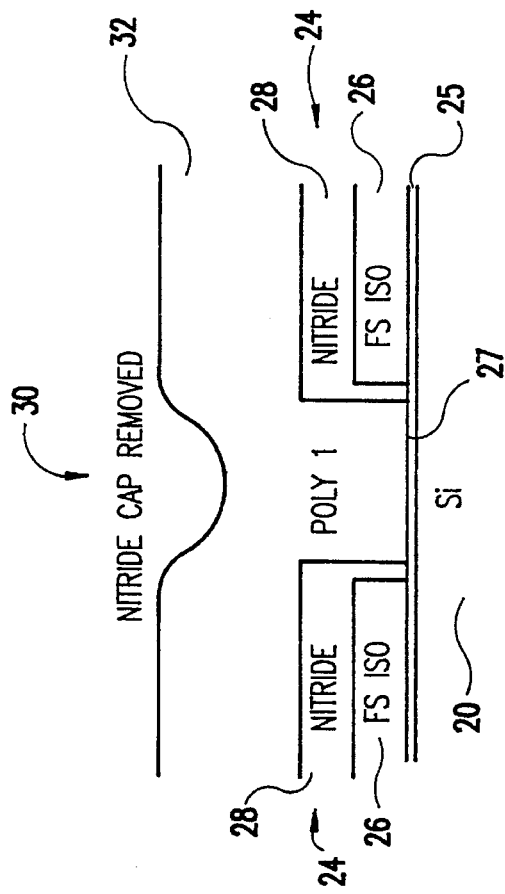
FIG. 2b is a cross-sectional view of an above-surface isolation region in the same semiconductor substrate as is shown in FIG. 2b after application of the first layer of gate conductor material.
Figure 2A:
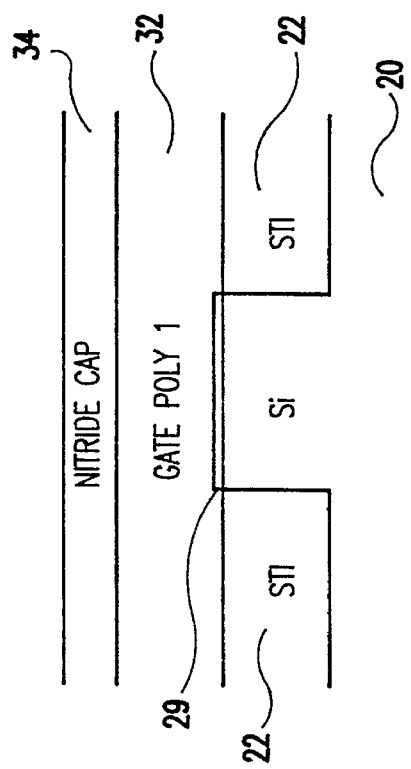
FIG. 2a is a cross-sectional view of a below-surface isolation region in a semiconductor substrate after application of the first layer of gate conductor material.

FIGS. 2a and 2b show the creation of a planarized gate conductor on a substrate having both field-shield isolation and STI; however, it should be understood that the planarization technique could be utilized on substrates having only above-surface isolation and could be used on substrates that include different above-surface and below surface isolation features (e.g., thick isolation dielectric, etc.). As discussed above, the field-shield isolation could be used for the DRAM array, while the STI could be used for the supports or peripheral circuitry such as CMOS logic.

The substrate 20 in FIGS. 2a and 2b, includes STI regions 22 and field-shield regions 24. The field-shield regions 24 comprise a plurality of conductive field shield isolation patterns 26 overcoated with an insulative layer 28 such as silicon nitride which serves the function of an interlayer dielectric. The combined thickness of the field shield isolation patterns 26 and protective layer 28 typically ranges between 600 and 6000 Å. Dielectric materials such as $SiO_2$ are used as the field-shield insulator 25 and the gate dielectrics 27 and 29, and these materials can be deposited or thermally grown or applied by other means. Openings 30 are made in the field shield isolation for the active device areas using standard techniques such as photolithography and etching. A gate conductor 32 material, such as polysilicon, silicide, metal, etc., is then deposited over both the STI isolated region shown in FIG. 2a and the field shield isolated region shown in FIG. 2b. To assure planarity, the gate conductor 32 should be approximately equal to the thickness of the field-shield regions 24 (i.e., the total thickness of the field-shield conductor 26 and the insulator layer 28). Preferably, the gate conductor is no more than 10% greater or smaller than the thickness of the field-shield regions. As is best shown in FIG. 2b, a depression results at the opening 30 which is the site of the active area/isolation step.

In the case of a substrate having both above-surface and below-surface isolation schemes, a protective cap 34 such as silicon nitride, silicon dioxide, or the like is deposited over both regions (e.g., the STI region shown in FIG. 2a, and the field-shield region shown in FIG. 2b). However, in the case of a substrate having only above-surface isolation, the cap 32 is not needed.

Figure 3B:
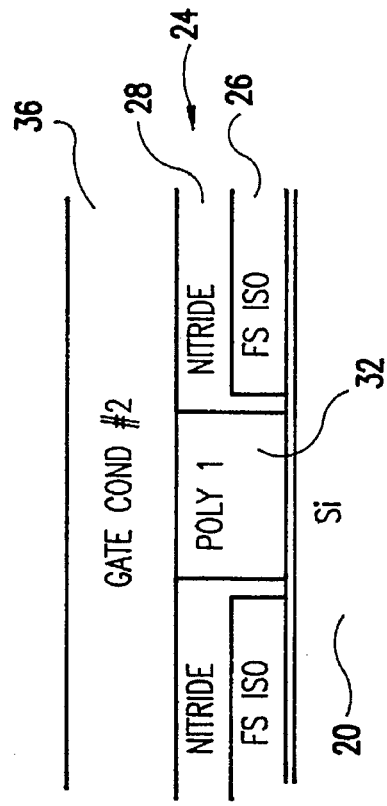
FIG. 3a–b are cross-sectional views of the below-surface and above-surface isolation regions shown in FIGS. 2a–b, respectively, after application of the second layer of gate conductor material.

As is best shown by contrasting FIGS. 2a and 2b, a mask (not shown) is used to remove the protective cap 32 from the portion of the substrate (chip, wafer, etc.) having above surface isolation, such as field-shield isolation in a DRAM array. Subsequently, as is best shown in FIG. 3b, chemical-mechanical polishing or another suitable process that selectively removes the polysilicon in gate conductor 32 relative to the silicon nitride in the protective cap 34 is used to remove the gate conductor 32 down to the level of the field-shield regions 24. This process leaves a portion of the gate conductor 32 between the field-shield regions 24, and leaves gate conductor 32 over the STI regions. The protective cap 34 protects the underlying gate conductor 32 in the STI region during chemical-mechanical polishing.

After polishing, the protective cap 34 is removed from the STI isolated portion of the substrate (e.g., the peripheral circuitry such as CMOS logic). In the case of the protective cap 34 being silicon nitride, removal of the cap can be achieved by etching with hot phosphoric acid or by reactive ion etching (RIE). It should be noted that the protective cap 34 should be removed from the STI isolated region shown in FIG. 2a, but the insulating layer 28 of the field-shield region shown in FIG. 2b should not be removed. This can be accomplished by using different materials for the insulating layer 28 and the protective cap 34, and using an etchant that is selective for the material in the protective cap 34. Alternatively, if the protective cap 34 and the insulating layer 28 are the same material (e.g., silicon nitride), the protective cap 34 should be smaller in thickness than the insulating layer 28 so that removal of the protective cap 34 can be achieved without removing all of the insulating layer 28. This is easily accomplished since the protective cap 34 serves the function of a polishing stop layer, and need not be very thick.

Figure 3A:
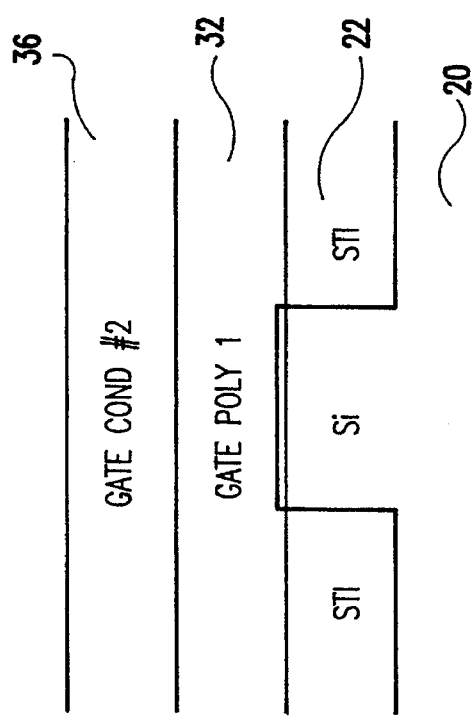

As is shown in FIGS. 3a and 3b, a second layer of conductive material 36, such as polysilicon, silicide, metal, etc., is deposited over the entire substrate to produce a substrate with a planar gate conductor in both the STI isolated region and the field-shield isolated region. Hence, after deposition of the conductive material 36, patterning and etching can proceed without DOF effects and stringer formation due to the fact that the entire structure has a planar gate conductor (e.g., non-planar regions are eliminated).

Normal processing of the semiconductor substrate can proceed after formation of the planar gate conductor.

While the invention has been described in terms of its preferred embodiments, those skilled in the art will recognize that the invention can be practiced with modification within the spirit and scope of the appended claims.

We claim:

1. A substrate having both above-surface isolation and below-surface isolation in first and second separate regions of said substrate, respectively, comprising:

a first region of said substrate having below surface isolation with a top of said below-surface isolation positioned at or below an uppermost top surface of said substrate, said below-surface isolation extending below said uppermost top surface of said substrate;

a second region of said substrate having above-surface isolation with a bottom of said above-surface isolation positioned at or above said uppermost top surface of said substrate, said above-surface isolation including a plurality of spaced apart isolation members which project above said uppermost top surface of said substrate, said second region of said substrate being separate from said first region;

a first gate conductor portion positioned above said first region of said substrate and between said plurality of spaced apart isolation members in said second portion of said substrate; and a second gate conductor portion positioned over said first gate conductor portion, said second gate conductor being co-planar in both said first and second regions of said substrate.

2. The substrate of claim 1 wherein said below surface isolation in said first portion of said substrate comprises trench isolation.

3. The substrate of claim 1 wherein said above-surface isolation in said second portion of said substrate comprises field shield isolation.

4. The substrate of claim 1 wherein said above-surface isolation in said second portion of said substrate comprises thick dielectric.

5. The substrate of claim 1 wherein said first and second gate conductor portions are formed of the same material.

6. The substrate of claim 5 wherein said material is polysilicon.

* * * * *